United States Patent
Jung et al.

(10) Patent No.: US 7,745,068 B2
(45) Date of Patent: Jun. 29, 2010

(54) BINARY PHOTOMASK HAVING A COMPENSATION LAYER

(75) Inventors: Jin-Sik Jung, Seoul (KR); Hee-Bom Kim, Suwon-si (KR); Woo-Sung Han, Seoul (KR); Sung-Min Huh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1037 days.

(21) Appl. No.: 11/446,980

(22) Filed: Jun. 6, 2006

(65) Prior Publication Data

US 2007/0054200 A1    Mar. 8, 2007

(30) Foreign Application Priority Data

Sep. 2, 2005   (KR) ............... 10-2005-0081848

(51) Int. Cl.
    *G03F 1/14*    (2006.01)
(52) U.S. Cl. ............................................. 430/5
(58) Field of Classification Search ............ 430/5
    See application file for complete search history.

(56) References Cited

U.S. PATENT DOCUMENTS

| 4,537,813 | A | * | 8/1985 | Kuyel | 430/5 |
|---|---|---|---|---|---|
| 5,290,647 | A | * | 3/1994 | Miyazaki et al. | 430/5 |
| 5,298,351 | A | * | 3/1994 | Bobroff et al. | 430/5 |
| 5,380,608 | A | * | 1/1995 | Miyashita et al. | 430/5 |
| 5,561,010 | A | * | 10/1996 | Hanyu et al. | 430/5 |
| 5,563,009 | A | * | 10/1996 | Bae | 430/5 |
| 5,786,113 | A | * | 7/1998 | Hashimoto et al. | 430/5 |
| 6,338,921 | B1 | * | 1/2002 | Bruce et al. | 430/5 |
| 2002/0122995 | A1 | * | 9/2002 | Mancini et al. | 430/5 |
| 2003/0157415 | A1 | * | 8/2003 | Ziger | 430/5 |

FOREIGN PATENT DOCUMENTS

| JP | 58-207048 | | 12/1983 |
|---|---|---|---|
| JP | 07-134392 | | 5/1995 |
| JP | 2005-055815 | | 3/2005 |
| KR | 1020000001790 | A | 1/2000 |
| KR | 1020010002127 | A | 1/2001 |
| KR | 1020020052740 | A | 7/2002 |
| KR | 1020030056499 | A | 7/2003 |
| KR | 1020040008472 | A | 1/2004 |

OTHER PUBLICATIONS

Korean Intellectual Property Office Notice to Submit Response dated Aug. 31, 2006 and English Translation.
Office Action dated Apr. 14, 2010, issued in corresponding Chinese Patent Application No. 200610129040.1.

* cited by examiner

*Primary Examiner*—Mark F Huff
*Assistant Examiner*—John Ruggles
(74) *Attorney, Agent, or Firm*—Harness, Dickey & Pierce, P.L.C.

(57) ABSTRACT

A binary photomask with an improved resolution and a method of manufacturing the same are provided. The binary photomask may include a substrate, a transmission-prevention pattern formed on the substrate to define a circuit pattern, and a compensation layer configured to change light transmitted through the binary photomask based on a topology of the compensation layer and arranged on the transmission-prevention layer and/or the substrate.

20 Claims, 9 Drawing Sheets

BINARY PHOTOMASK HAVING A COMPENSATION LAYER

PRIORITY STATEMENT

This application claims the benefit of Korean Patent Application No. 10-2005-0081848, filed on Sep. 2, 2005, in the Korean Intellectual Property Office, the entire contents of which is incorporated herein by reference.

BACKGROUND OF THE INVENTION

1. Field of the Invention

Example embodiments of the present invention relate to a photomask and a method of manufacturing the same, and more particularly, to a binary photomask for defining a photoresist pattern using a transmission-prevention pattern and a method of manufacturing the same.

2. Description of the Related Art

Generally, a mask (e.g., a reticle) is used to form a circuit pattern on a semiconductor substrate. The mask may include an optically transparent quartz substrate and a transmission-prevention pattern (e.g. a chrome pattern) formed on a surface of the quartz substrate. However, if a line width of a circuit pattern in a semiconductor substrate is smaller than a wavelength $\lambda$ of an exposure light source, it is difficult to form an image on a pupil lens using a first-order light because a diffraction angle of the first-order light passing through the mask may be increased. Even if the image is formed on the pupil lens, contrast may be weak. Therefore, forming a fine pattern, which has a line width smaller than a wavelength of an exposure light source, using a binary mask, which defines a circuit pattern using a transmission-prevention pattern may be difficult.

Conventionally, a phase shift mask using a destructive interference of 0° and 180° may be provided to improve a resolution of a binary mask. A phase shift mask may be classified into an attenuated phase shift mask forming a 180° phase region by using a phase shift material (e.g. MoSiON), and an alternating phase shift mask forming a 180° phase region and a chrome layer by using a trench of the quartz substrate. A chromeless (Cr-less) phase shift mask and a rim-type photomask (a rim mask) are an advanced form of the phase shift mask. A chromeless phase shift mask may form a photoresist pattern by generating a destructive interference on a surface of a 0° phase region (a surface region of the quartz substrate) and a 180° phase region (a trench region). Additionally, the rim mask may complete a photoresist pattern on a semiconductor substrate by forming a chrome pattern on a 0° phase region of the chromeless phase shift mask.

However, phase shift masks as described above may require a plurality of etching processes to form trenches in the quartz substrate and a process to form a chrome pattern in each of the trenches. Therefore, these phase shift masks are generally considered more difficult to manufacture than a binary mask.

SUMMARY OF THE INVENTION

Example embodiments of the present invention provide a binary photomask with an improved resolution.

Example embodiments of the present invention provide a binary photomask with improved resolution that may be manufactured using relatively simple processes.

An example embodiment of the present invention provides a binary photomask. The binary photomask may include a substrate; a transmission-prevention pattern arranged on the substrate to define a circuit pattern; and a compensation layer arranged on at least one of the substrate and the transmission-prevention pattern and configured to change light transmitted through the binary photomask based on a topology of the compensation layer.

An example embodiment of the present invention provides a method of manufacturing a binary photomask. The method may include forming a transmission-prevention layer on a transparent substrate; and forming a compensation layer configured to change light transmitted through the binary photomask based on a topology of the compensation layer on at least one of the transmission-prevention layer and the transparent substrate.

An example embodiment of the present invention provides a binary photomask. The binary photomask may include a quartz substrate; a transmission-prevention pattern defining a circuit pattern on the quartz substrate; and a compensation layer having a three-dimensional topological structure formed on the quartz substrate with the transmission-prevention pattern.

An example embodiment of the present invention provides a binary photomask. The binary photomask may include a substrate; a transmission-prevention pattern formed on the substrate to define a circuit pattern; and a transparent compensation pattern formed on the transmission-prevention pattern.

A transmission-prevention pattern and a compensation pattern according to an example embodiment of the present invention may have the same line width and a sidewall of the compensation pattern may correspond to a sidewall of the transmission-prevention pattern. Additionally, a line width of the compensation pattern may be smaller than that of the transmission-prevention pattern.

At least one sidewall of the compensation pattern may include a sidewall of the transmission-prevention pattern. One sidewall of the compensation pattern may include the sidewall of the transmission-prevention pattern and another sidewall of the compensation pattern may be disposed on the top of the transmission-prevention pattern.

In an example embodiment of the present invention, the compensation pattern may have a thickness of 10-5000 Å. In an example embodiment of the present invention, the compensation pattern may have a thickness of 2000-3000 Å. The compensation pattern may be not limited to a kind of material but a transparent material (e.g. silicon oxide film) may be more effective to improve a resolution.

An example embodiment of the present invention provides a method of manufacturing a binary photomask. The method may include forming a transmission-prevention pattern on a transparent substrate; and forming a compensation layer with a uniform thickness on the transparent substrate with the transmission-prevention pattern along a surface thereof. The compensation layer may be formed using one of a sputtering process and a CVD (chemical vapor deposition) process.

An example embodiment of the present invention provides a method of manufacturing a binary photomask. The method may include forming a transmission-prevention layer on a transparent semiconductor substrate, forming a compensation layer on the transmission-prevention layer; and patterning the compensation layer and the transmission-prevention layer.

According to the photomask of example embodiments of the present invention, the pattern resolution may be improved by the compensation layer with a three dimensional topology.

BRIEF DESCRIPTION OF THE DRAWINGS

Example embodiments of the present invention will be more clearly understood from the detailed description taken in conjunction with the accompanying drawings.

DETAILED DESCRIPTION OF EXAMPLE EMBODIMENTS OF THE INVENTION

Figure 1:
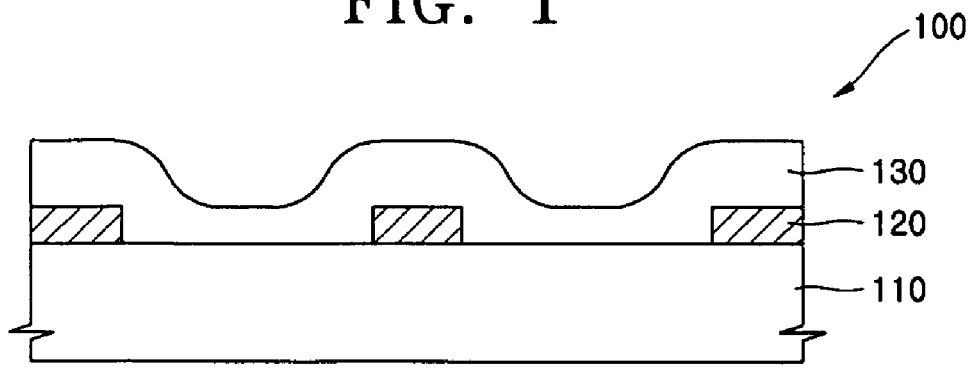
FIG. 1 is a sectional view of a photomask having a compensation layer with a three-dimensional topology structure according to an example embodiment of the present invention.

Various example embodiments of the present invention will now be described more fully with reference to the accompanying drawings in which some example embodiments of the invention are shown. In the drawings, the thicknesses of layers and regions may be exaggerated for clarity. Further, like numbers refer to like elements throughout the description of the drawings.

Detailed illustrative embodiments of the present invention are disclosed herein. However, specific structural and functional details disclosed herein are merely representative for purposes of describing example embodiments of the present invention. This invention may be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the drawings. For example, two FIGs. shown in succession may in fact be executed substantially concurrently or may sometimes be executed in the reverse order, depending upon the functionality/acts involved.

In the FIGs, if a layer is formed on another layer or a substrate, it means that the layer is directly formed on another layer or a substrate, or that a third layer is interposed therebetween. In the following description, the same reference numerals denote the same elements.

Although the example embodiments of the present invention have been disclosed for illustrative purposes, those skilled in the art will appreciate that various modifications, additions and substitutions are possible, without departing from the scope and spirit of the invention as disclosed in the accompanying claims.

According to an example embodiment of the present invention, a resolution of a binary photomask may be improved by forming a film having a three-dimensional topological structure on the top of the binary photomask. The film having the three-dimensional topological structure may function to increase the intensity of light by changing a phase of an incident light. Therefore, a fine pattern may be formed.

A photomask having a film with a three-dimensional topological structure and a method of manufacturing the same will now be described in more detail with reference example embodiments of the present invention shown in the drawings.

Figure 2:
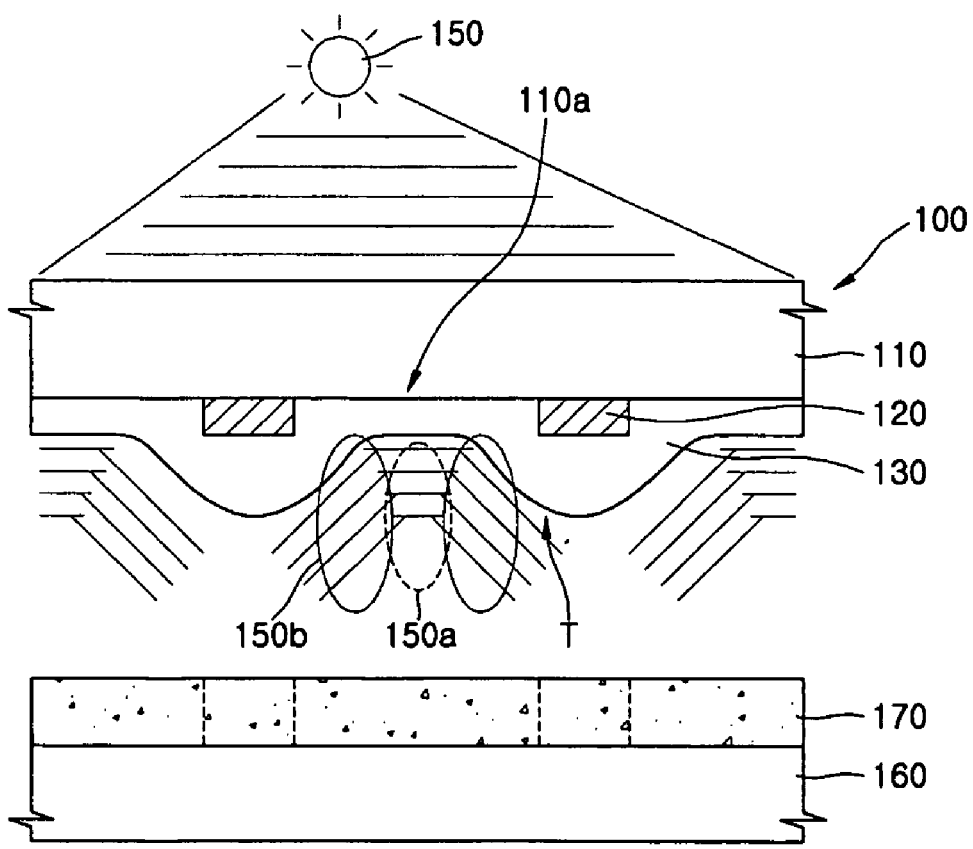
FIG. 2 is a schematic view illustrating a light delivery path of a photomask according to an example embodiment of the present invention.

FIG. 1 is a sectional view of a photomask 100 having a compensation layer 130 with a three-dimensional topological structure according to an example embodiment of the present invention. FIG. 2 is a schematic view illustrating a light delivery path of the photomask 100 according to an example embodiment of the present invention.

Referring to FIG. 1, the photomask 100 may include an optically transparent mask substrate 110 (e.g., a quartz substrate). Additionally, a transmission-prevention pattern 120 may be formed to define a circuit pattern on the mask substrate 110. A chrome (Cr) pattern may be used for the transmission-prevention pattern 120. A compensation layer 130 may be formed to compensate a resolution of a binary mask on the mask substrate 110 with the transmission-prevention pattern 120. A three-dimensional topological structure may be obtained on a surface of the compensation layer 130 according to a height of the transmission-prevention pattern 120. For example, the compensation layer 130 may be deposited on the mask substrate 110 to substantially conform with the transmission-prevention pattern 120. The compensation layer 130 on the mask substrate 110 may be formed to conform with the transmission-prevention pattern 120 using a sputtering process and/or a chemical vapor deposition (CVD) process, for example. The compensation layer 130 may be a transparent layer.

As illustrated in an example embodiment of the present invention shown in FIG. 2, the phase of an incident light of the photomask 100 may be changed by the topology of the photomask 100 when projecting the light from a light source 150. Here, a reference numeral 150a represents light passing through a transmission part of the photomask 100, and a reference numeral 150b represents the transmitted light changed by the topology T of the photomask 100.

Additionally, a reference numeral 170 represents a photoresist film, which may be exposed by the transmitted light 150a and 150b. A reference numeral 160 represents a semiconductor substrate on which the photoresist film may be formed.

Figure 3:
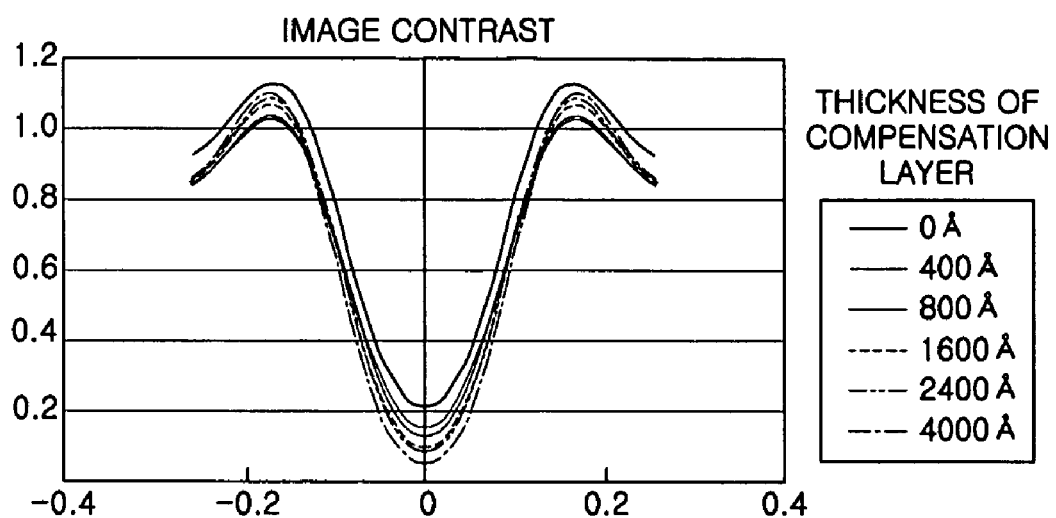
FIG. 3 is a graph illustrating image contrasts of photomasks with respect to thickness of compensation layers.

FIG. 3 is a graph illustrating an image contrast of a photomask according to an example embodiment of the present invention. Referring to FIG. 3, a binary mask having a compensation layer 130 with a topology T may be sharper in terms of an image contrast, compared with a photomask without the compensation layer 130.

There are many reasons why the resolution of a pattern may be increased by the compensation layer 130 with the topology T. An important and/or most prominent reason is that the intensity of the first-order light may be increased due to a change of the phase of the incident light by the topology T of the compensation layer 130.

Figure 4:
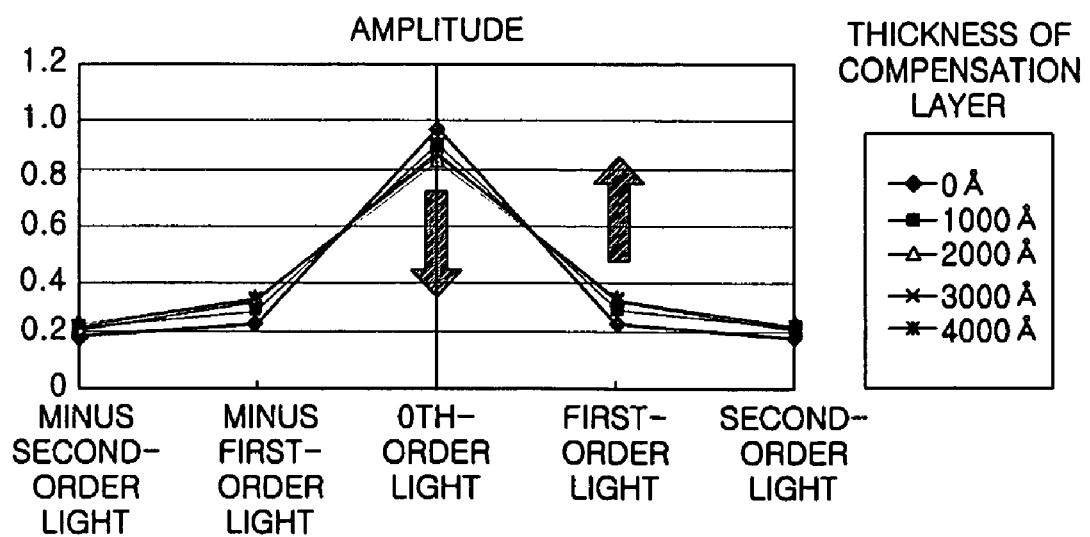
FIG. 4 is a graph illustrating the amplitude of various orders of light of photomasks with respect to thickness of compensation layers.

FIG. 4 is a graph illustrating the intensity (amplitude) of a 0th-order light and the intensity of a first-order light of a photomask. Referring to FIG. 4, when comparing a case when the photomask has the compensation layer 130 (1000 Å, 2000 Å, 3000 Å and 4000 Å) to a case when the photomask is without the compensation layer 130 (thickness of 0 Å), when the compensation layer 130 is included the intensity of the first-order light increases while the intensity of the 0th-order light decreases. Accordingly, the intensity of the first-order may gradually increase in proportion to the thickness of the compensation layer 130. An image contrast of a pattern may be improved when the intensity of the 0th-order light decreases and the intensity of the first-order light increases, and thus a resolution of the pattern may be improved. Accordingly, the image contrast and the pattern resolution may be improved by forming the compensation layer 130 with the topology T on the binary photomask, which may increase the intensity of the first-order light.

Figure 5:
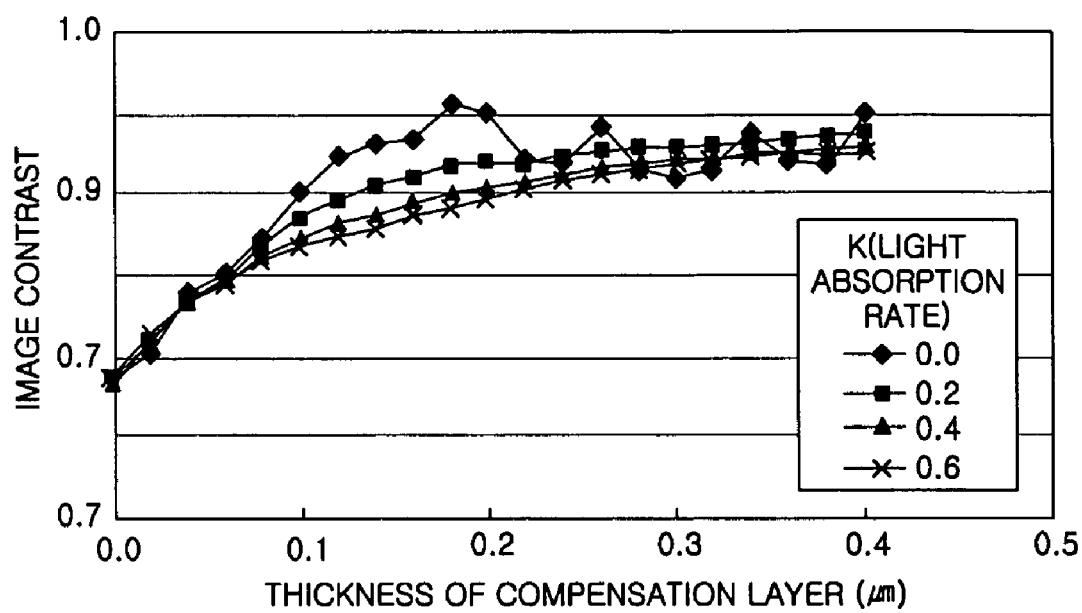
FIG. 5 is a graph of image contrasts according to absorption rates and thickness of compensation layers in photomasks.

FIG. 5 is a graph of an image contrast according to an absorption rate of a compensation layer in a photomask. Additionally, when adjusting a light absorption rate (k) of a silicon oxide film with a refractive index (n) of 1.56, an image contrast is illustrated relative to the thickness of a compensation layer 130. Referring to FIG. 5, the image contrast increases as the thickness of the compensation layer increases. Additionally, the image contrast increases as the light absorption ratio decreases (e.g., becomes more transparent) in the compensation layer 130 having a thickness of about 0.1-0.3 μm.

Figure 6:
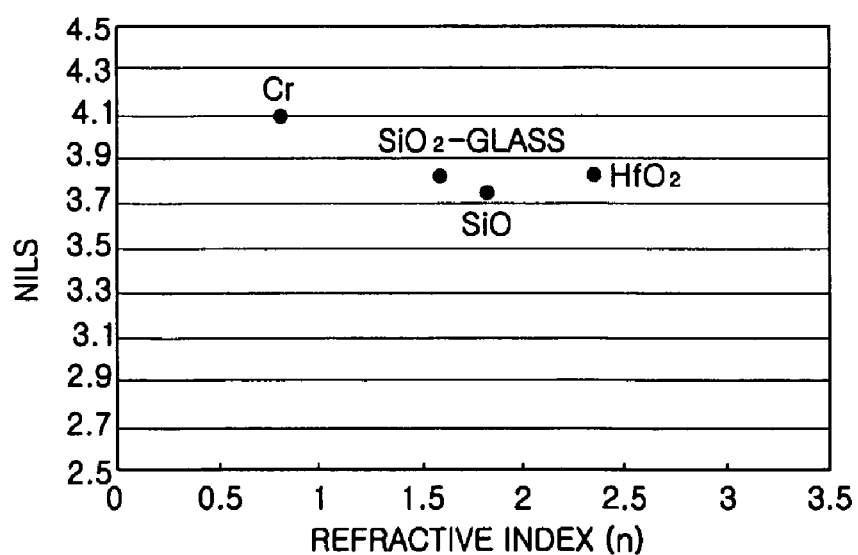
FIG. 6 is a graph of normalized image log slopes (NILS) verses refractive indexes of compensation layers in photomasks.

As described above, if a compensation layer 130 with a three-dimensional topological structure is formed on the top of the transmission-prevention layer 120, the intensity of the first-order light may increase and/or the resolution may increase according to an example embodiment of the present invention. Furthermore, if a thickness of a compensation layer 130 increases and the compensation layer 130 is formed of a transparent material that does not absorb light, the resolution may be improved according to an example embodiment of the present invention. Additionally, as illustrated in the example embodiment of the present invention shown in FIG. 6, as the refractive index of a compensation layer 130 increases, the resolution of the compensation layer 130 may be improved more according to an example embodiment of the present invention.

Resolution (e.g., an image contrast of a pattern) may be improved by forming a compensation layer 130 with a three-dimensional topological structure on a photomask 100 according to an example embodiment of the present invention. Additionally, if the refractive index n of a compensation layer 130 increases, the absorption rate k may decrease. Thus, the resolution of the compensation layer 130 may be further improved according to an example embodiment of the present invention. Moreover, a compensation layer 130 according to an example embodiment may be formed of a variety of materials. For example, the compensation layer 130 may be formed of a material selected from a group including silicon oxide, silicon nitride, hafnium oxide, etc., which are transparent layers, and/or a stacked layer of a combination of the materials.

Even if the compensation layer has a pattern shape, the resolution may still be improved according to an example embodiment of the present invention.

Figure 7:
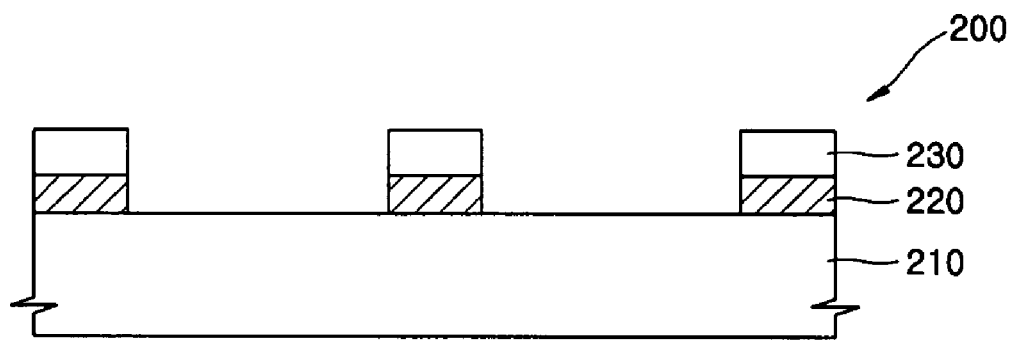
FIG. 7 is a sectional view of a photomask with a compensation pattern according to another embodiment of the present invention according to an example embodiment of the present invention.

FIG. 7 is a sectional view of a photomask with a compensation pattern according to an example embodiment of the present invention. As illustrated in FIG. 7, a photomask 200 may include an optically transparent mask substrate 210 and a transmission-prevention pattern 220 on the mask substrate 210. A compensation pattern 230 may be formed on the top of the transmission-prevention pattern 220. The compensation pattern 230 may have a contact surface with a size substantially identical to the size of the contact surface of the transmission-prevention pattern 220 according to an example embodiment of the present invention.

Figure 8A:
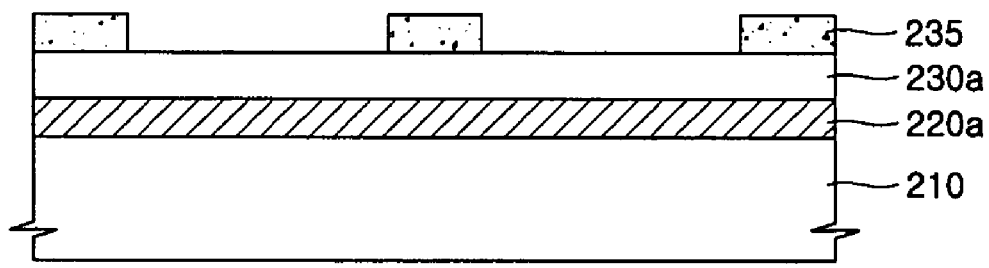
FIGS. 8A and 8B are sectional views illustrating a method of manufacturing a photomask with a compensation pattern according to an example embodiment of the present invention.
Figure 8B:
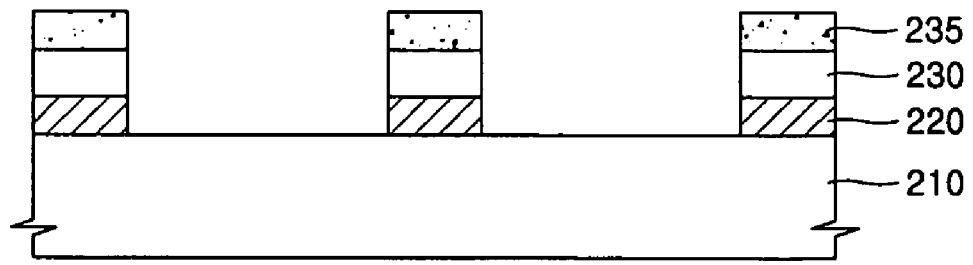

FIGS. 8A and 8B are sectional views illustrating a method of manufacturing a photomask with a compensation pattern according to an example embodiment of the present invention. As illustrated in FIG. 8A, a transmission-prevention layer 220a may be formed on a mask substrate 210. A compensation layer 230a may be formed on the transmission-prevention layer 220a. The compensation layer may be formed of a transparent material, for example, silicon oxide, silicon nitride, etc. The compensation layer 230a may be formed to a thickness of 100-5000 Å according to an example embodiment of the present invention. Resist patterns 235 may be formed in the shape of circuit patterns on the compensation layer 230a.

As illustrated in FIG. 8B, a compensation pattern 230 and a transmission-prevention pattern 220 may be formed by etching the compensation layer 230a and the transmission-prevention layer 230b using the resist patterns 235 as a mask. The resist pattern 235 may then be removed as illustrated in an example embodiment of the present invention shown in FIG. 7.

A pattern-shaped compensation layer 230 (e.g., the compensation pattern) may be provided with a three-dimensional topological structure due to sidewalls of the pattern.

Figure 9:
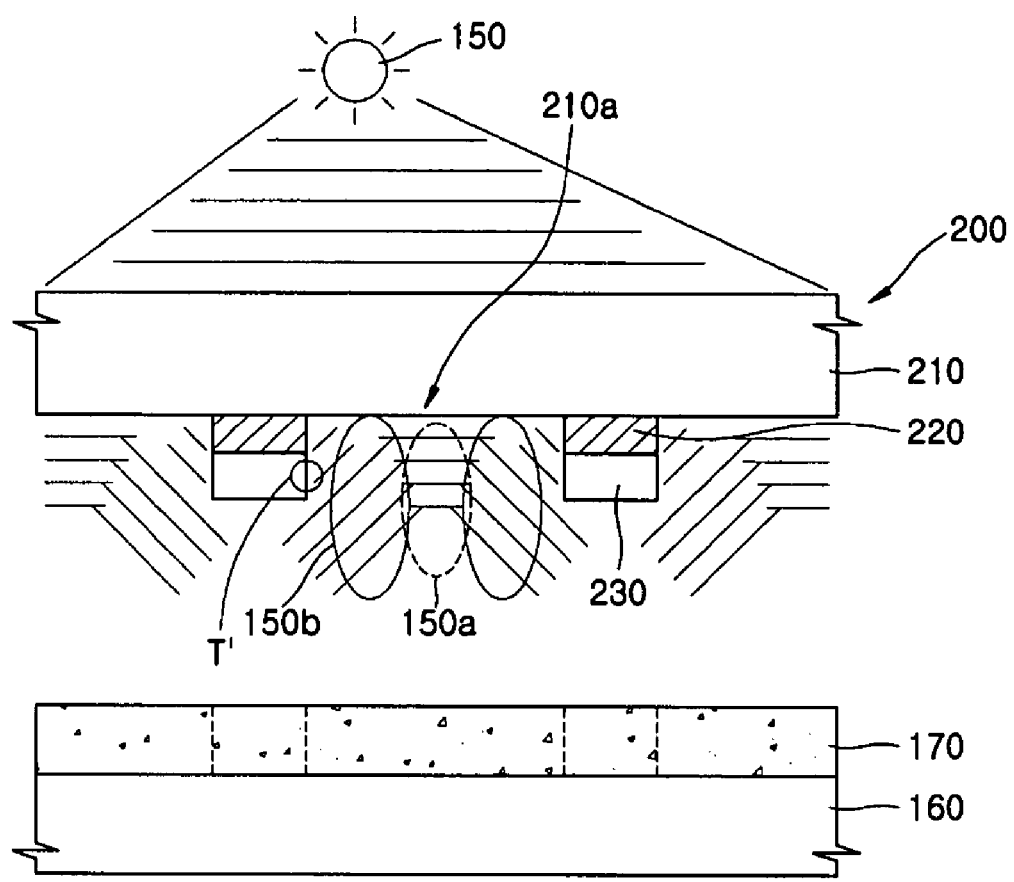
FIG. 9 is a schematic view illustrating a light delivery path of a photomask according to another example embodiment of the present invention.

FIG. 9 is a schematic view illustrating a light delivery path of a photomask according to an example embodiment of the present invention. As illustrated in FIG. 9, a phase deformation may occur on a sidewall T' of a compensation pattern 230, and thus the intensity of the first-order light may be increased.

Figure 10:
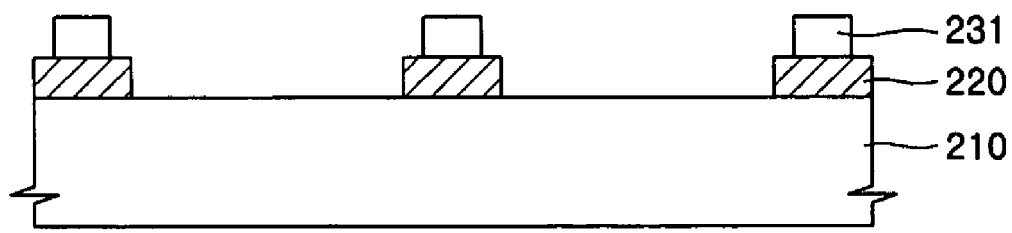
FIGS. 10 through 12 are sectional views illustrating various forms of a photomask with a compensation pattern according to example embodiments of the present invention.
Figure 11:
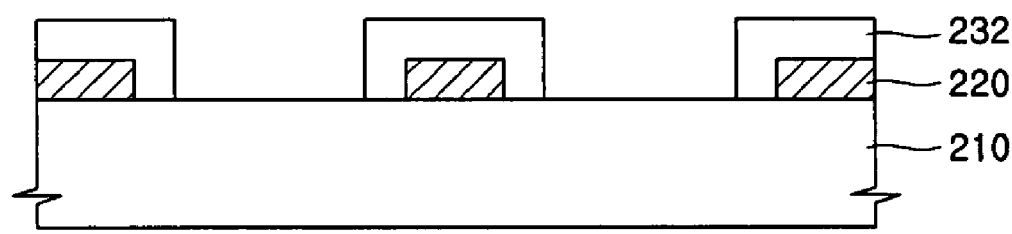
Figure 12:
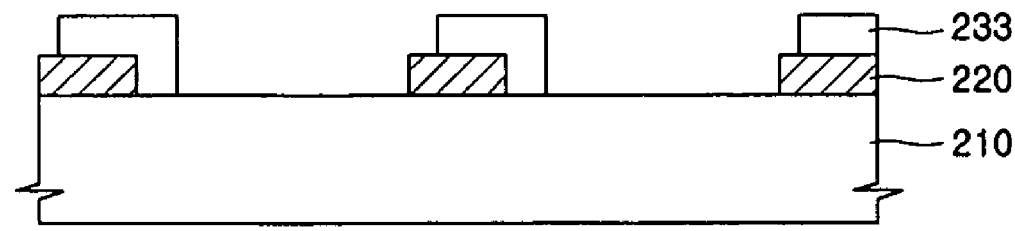

FIGS. 10 through 12 are sectional views illustrating various forms of a photomask with a compensation pattern according to example embodiments of the present invention. Referring to an example embodiment of the present invention illustrated in FIG. 10, a compensation pattern 231 may be formed narrower than a line width of a transmission-prevention pattern 220. Referring to an example embodiment of the present invention shown in FIG. 11, a compensation pattern 232 may be formed to encompass a transmission-prevention pattern 220. Moreover, in an example embodiment of the present invention as shown in FIG. 12, a first sidewall of a transmission-prevention pattern 220 compensation pattern 233 may be covered by a compensation pattern 233 and a second sidewall of the transmission-prevention pattern 220 may be exposed.

Figure 13A:
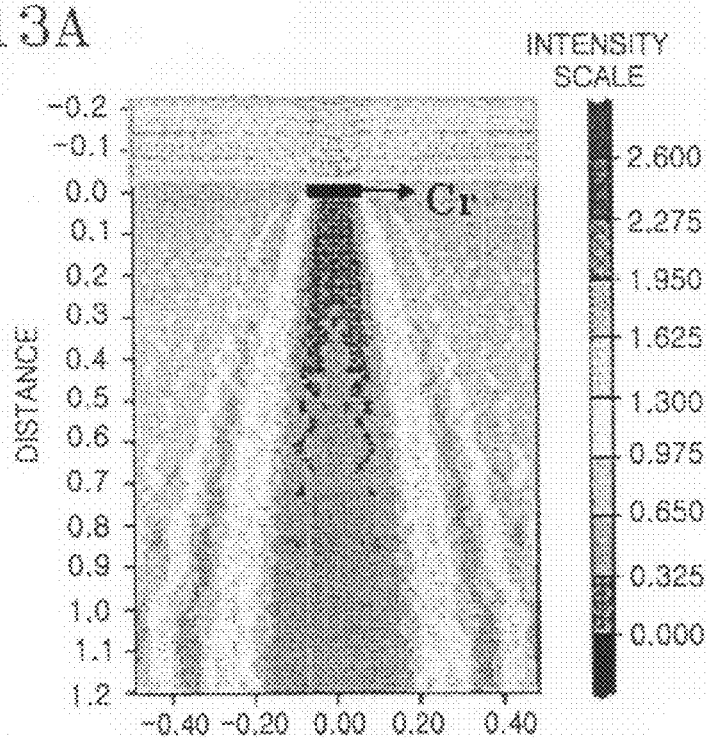
FIGS. 13A and 13B are simulation graphs illustrating an intensity distribution of binary photomasks.
Figure 13B:
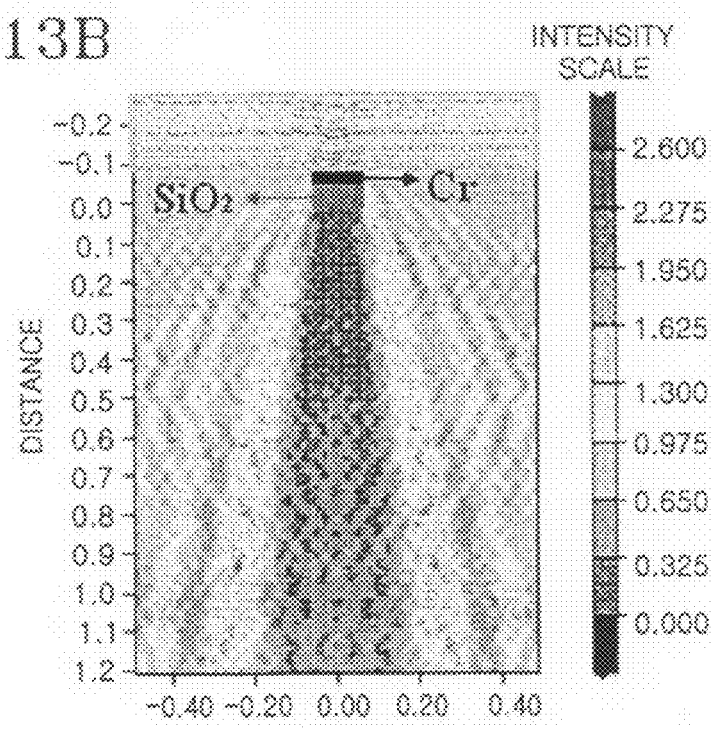

FIGS. 13A and 13B are simulation graphs illustrating an intensity distribution of a binary photomask. FIG. 13A is a simulation graph illustrating a distribution of the binary photomask without a compensation pattern. FIG. 13B is a simulation graph illustrating a distribution of the binary photomask with a compensation pattern according to an example embodiment of the present invention. In FIGS. 13A and 13B, the transmission-prevention pattern 220 and the compensation pattern 230 have a line width of about 65 nm and the compensation pattern 230 is formed of a silicon oxide film with a thickness of about 2400 Å.

As illustrated in FIG. 13A, in the case of a conventional photo mask without a compensation pattern, a region corresponding to a distance from the upper surface of the transmission-prevention pattern to only about 0.6 µm had an intensity of near zero, and the other regions had an intensity of about 0.6 or more. As illustrated in FIG. 13B, in the case of the photo mask with a compensation pattern 230 according to an example embodiment of the present invention, a region corresponding to a distance from the upper surface of the transmission-prevention pattern to about 1.2 µm had an intensity of near zero, and furthermore, a distribution with a zero-intensity was sharper than that of FIG. 13A.

Figure 14:
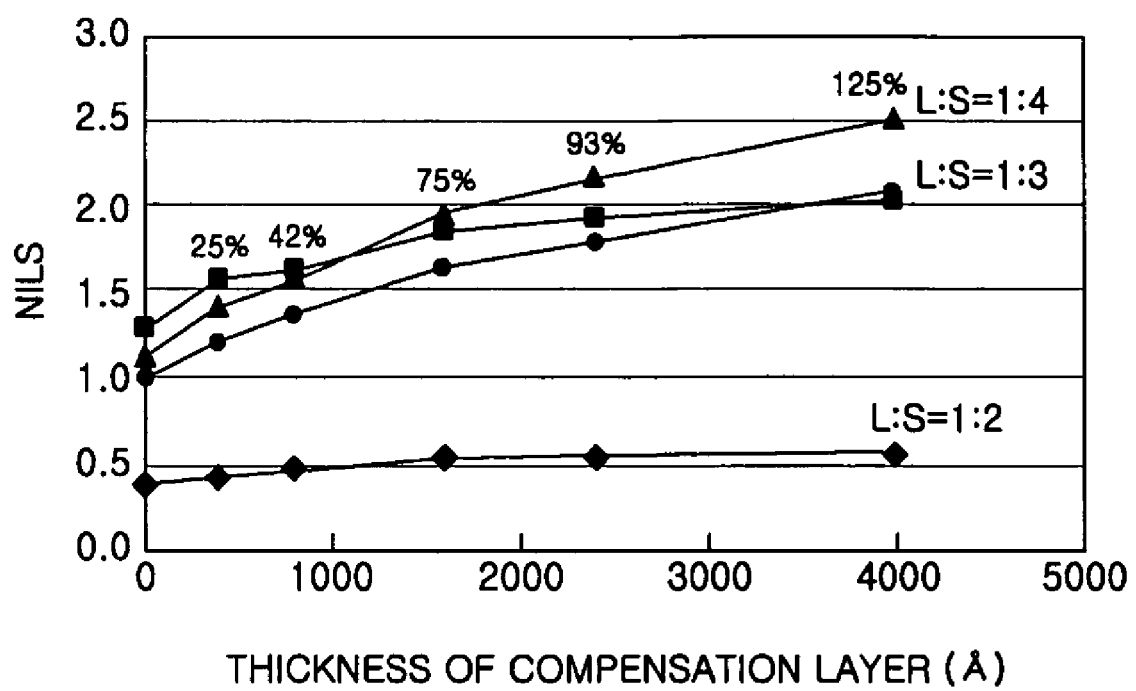
FIG. 14 is a graph illustrating an NILS distribution according to a line and space ratio of photomasks.

FIG. 14 is a graph illustrating an NILS (normalized image log slope) distribution according to a line and space ratio of a photomask. The NILS is a variable representing an image contrast of a pattern, and represents a slope of an image contrast curve. The image contrast may be better when the NILS value is large. Additionally, referring to FIG. 14, a distribution of the NILS is illustrated when adjusting a line width of a transmission-prevention pattern and a space between transmission-prevention patterns. Accordingly, the NILS may be further improved if a line to space ratio increases. According to an example embodiment of the present invention, a photomask may be provided to form a pattern having a line-to-space ratio of below 1:1000, for example, 1:2, 1:3, etc.

Figure 15:
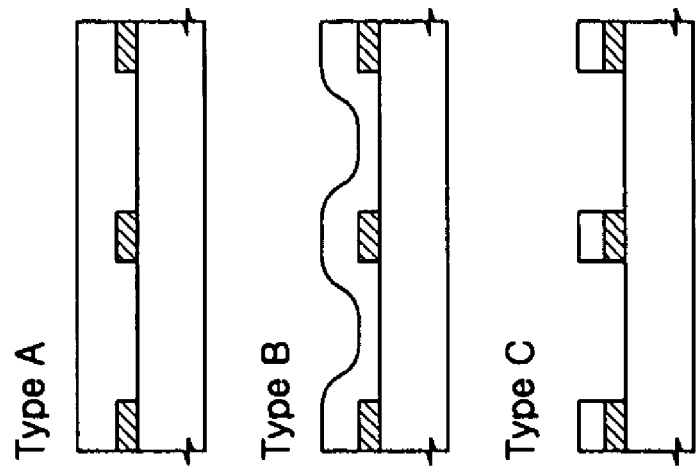
FIG. 15 is a graph illustrating an NILS distribution according to a surface form of a compensation layer.
Figure 15:
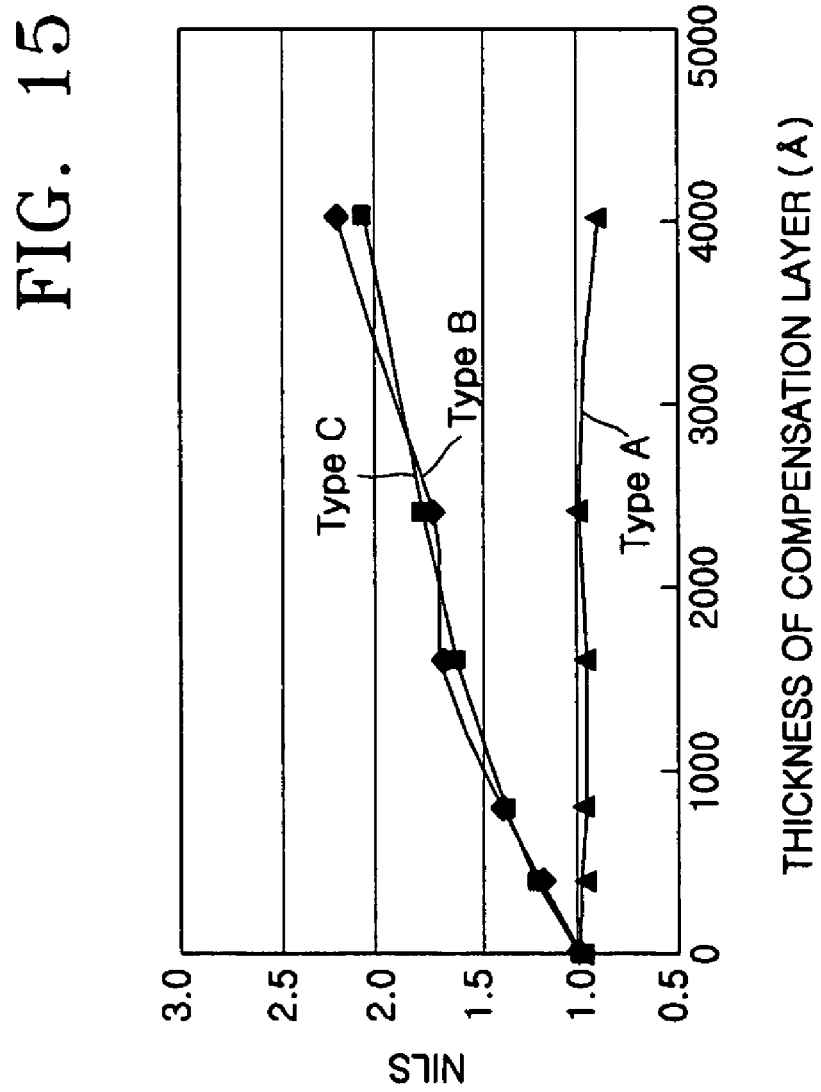

FIG. 15 is a graph illustrating a NILS distribution according to a surface form of a compensation layer. In FIG. 15, type A is a compensation layer without a topological structure, type B is a compensation layer with the topological structure on the substrate having a transmission region and a transmission prevention pattern and type C is a compensation pattern with the topological structure on a transmission-prevention pattern. Referring to FIG. 15, the NILS value may increase in types B and C. In a type A when the compensation layer is formed without the topological structure, the NILS may not change.

While the present invention has been particularly shown and described with reference to example embodiments thereof, it will be understood by those of ordinary skill in the art that various changes in form and details may be made therein without departing from the spirit and scope of the present invention.

What is claimed is:

1. A binary photomask, comprising:
   a substrate;
   a transmission-prevention pattern arranged on the substrate to define a circuit pattern; and
   a compensation layer arranged on at least one of the substrate and the transmission-prevention pattern, and configured to change light transmitted through the binary photomask based on a topology of the compensation layer;
   wherein the topology of the compensation layer changes the light transmitted through the binary photomask to decrease the intensity of $0^{th}$-order light and to increase the intensity of $1^{st}$-order light.

2. The binary photomask of claim 1, wherein the compensation layer has a three-dimensional topological structure.

3. The binary photomask of claim 1, wherein the substrate is a mask substrate.

4. The binary photomask of claim 1, wherein the compensation layer is a film, formed on a surface of the substrate and a surface of the transmission-prevention layer, and conforms with the transmission-prevention pattern.

5. The binary photomask of claim 1, wherein a ratio of a line width (L) of the transmission-prevention pattern to a space (S) between the transmission-prevention pattern and an adjacent transmission-prevention pattern is represented by L/S<1/2.

6. The binary photomask of claim 1, wherein the a ratio of a line width (L) of the transmission-prevention pattern to a space (S) between the transmission-prevention pattern and an adjacent transmission-prevention pattern is represented by L/S<1/3.

7. The binary photomask of claim 1, wherein the compensation layer is transparent.

8. The binary photomask of claim 1, wherein the compensation layer has a thickness greater than or equal to 100 angstroms and less than or equal to 5,000 angstroms.

9. The binary photomask of claim 1, wherein the compensation layer has a thickness greater than or equal to 2,000 angstroms and less than or equal to 5,000 angstroms.

10. The binary photomask of claim 1, wherein the compensation layer is a transparent material.

11. The binary photomask of claim 10, wherein the compensation layer is at least one of a silicon oxide layer, a silicon nitride layer, and a hafnium oxide layer.

12. The binary photomask of claim 1, wherein the compensation layer is patterned, and
    wherein the compensation layer includes a compensation pattern having at least one sidewall.

13. The binary photomask of claim 12, wherein a line width of the compensation pattern is smaller than a line width of the transmission-prevention pattern.

14. The binary photomask of claim 12, wherein the compensation pattern has a thickness greater than or equal to 10 angstroms and less than or equal to 5,000 angstroms.

15. The binary photomask of claim 12, wherein the compensation pattern has a thickness greater than or equal to 2,000 angstroms and less than or equal to 5,000 angstroms.

16. The binary photomask of claim 12, wherein the transmission-prevention pattern and the compensation pattern have a same line width.

17. The binary photomask of claim 16, wherein the at least one sidewall of the compensation pattern is in a same plane as at least one sidewall of the transmission-prevention pattern.

18. The binary photomask of claim 12, wherein the at least one sidewall of the compensation pattern is arranged on at least one sidewall of the transmission-prevention pattern.

19. The binary photomask of claim 18, wherein at least a portion of the top surface of the transmission-prevention pattern is covered by the compensation pattern.

20. A binary photomask, comprising:

a substrate;

a transmission-prevention pattern arranged on the substrate to define a circuit pattern; and a compensation layer arranged on at least one of the substrate and the transmission-prevention pattern, and configured to change light transmitted through the binary photomask based on a topology of the compensation layer;

wherein the topology of the compensation layer changes the light transmitted through the binary photomask to increase the intensity of $1^{st}$-order light.

* * * * *